United States Patent
Powers et al.

(10) Patent No.: US 7,504,904 B1
(45) Date of Patent: Mar. 17, 2009

(54) PRINTED-CIRCUIT IMPEDANCE CONTROL USING SKEWED REFERENCE MESH

(75) Inventors: Scott Powers, Wilmington, DE (US);
Sean M. McClain, Havertown, PA (US);
Ernest B. Bogusch, West Chester, PA (US)

(73) Assignee: Unisys Corporation, Blue Bell, PA (US)

( * ) Notice: Subject to any disclaimer, the term of this patent is extended or adjusted under 35 U.S.C. 154(b) by 296 days.

(21) Appl. No.: 11/397,156

(22) Filed: Apr. 4, 2006

(51) Int. Cl.
*H01P 3/08* (2006.01)

(52) U.S. Cl. .............................. 333/1; 333/33; 333/246
(58) Field of Classification Search .................. 333/1, 333/238, 246, 33
See application file for complete search history.

(56) References Cited

U.S. PATENT DOCUMENTS

| | | | | |
|---|---|---|---|---|
| 4,855,537 | A * | 8/1989 | Nakai et al. ................. 174/250 |
| 5,300,899 | A * | 4/1994 | Suski ............................. 333/1 |
| 6,559,377 | B1 * | 5/2003 | Noda et al. .................... 174/36 |
| 6,590,466 | B2 * | 7/2003 | Lin et al. ........................ 333/1 |
| 2004/0181764 | A1 | 9/2004 | Brist et al. | |

* cited by examiner

*Primary Examiner*—Benny Lee
(74) *Attorney, Agent, or Firm*—Richard J. Gregson; RatnerPrestia

(57) ABSTRACT

A printed circuit laminate is provided comprising at least one conductor trace for carrying forward electrical signals in a first direction of signal propagation. The printed circuit laminate also comprises a mesh reference plane, spaced from the at least one conductor trace, for carrying return electrical signals in a second direction. The mesh reference plane defines a plurality of cells. Each cell of the plurality of cells includes at least one axis of repetition. The plurality of cells are configured so that all of the axes of repetition of each cell are different from the first direction of signal propagation. Furthermore, the frequency of cell repetition along the first direction of signal propagation is chosen to reduce differences in transmission line impedance between any two conductors on the same laminate or any two conductors on different laminates.

10 Claims, 8 Drawing Sheets

US 7,504,904 B1

PRINTED-CIRCUIT IMPEDANCE CONTROL USING SKEWED REFERENCE MESH

BACKGROUND OF THE INVENTION

Electronic systems continue to demand increasingly higher performance in a progressively smaller space and at a progressively smaller cost. The current trend in electronic systems is to reduce the overall size, cost and complexity of system components to meet these requirements.

Rigid and flexible printed circuit laminates are commonly used in electronics to connect electrical/electronic components such as integrated circuits and connectors (referred to herein as components) to one another. A typical printed circuit laminate includes many layers of conductive material such as copper, with each layer of copper separated by a dielectric material. Generally, several of the copper layers are etched to form connection lines (e.g., "conductor traces").

Accordingly, manufacturers that are involved in the design and fabrication of printed circuit laminates may find it desirable to modify them in order to implement engineering improvements which may improve the performance, size, cost or reliability.

SUMMARY OF THE INVENTION

The present invention provides a printed circuit laminate comprising at least one conductor trace for carrying forward electrical signals in a first direction of signal propagation. The printed circuit laminate also comprises a mesh reference plane, spaced from the at least one conductor trace, for carrying return electrical signals in a second direction. The mesh reference plane defines a plurality of cells. Each cell of the plurality of cells includes at least one axis of repetition. The plurality of cells are configured so that all of the axes of repetition of each cell are different from the first direction of signal propagation.

The present invention further provides a method for orienting a mesh on a printed circuit laminate for controlled impedance. The method comprises orienting a mesh reference plane having a plurality of cells each having at least one axis of repetition such that all of the axes of repetition of each cell are different from the direction of at least one conductor trace.

The present invention further provides a method for controlling impedance in a printed circuit laminate. The method comprises determining a rise time and a period of impedance of a signal propagating in a first direction along a conductor trace. The method also comprises determining an angle of rotation between at least one axis of repetition of cells of a mesh reference plane and the first direction of signal propagation based on the rise time of the signal and the period of impedance of the signal along the conductor trace.

The present invention further provides a method for producing a printed circuit laminate having controlled impedance. The method comprises determining a rise time and a period of impedance of a signal propagating in a conductor trace. The method also comprises determining an angle of rotation between at least one axis of repetition of cells of a mesh reference plane and a direction of the conductor trace based on the rise time of the signal and the period of impedance of the signal along the conductor trace. The method further comprises orienting the mesh reference plane at the determined angle of rotation between the axis of repetition and the direction of the conductor trace.

BRIEF DESCRIPTION OF THE DRAWINGS

The invention is best understood from the following detailed description when read in connection with the accompanying drawings. Included in the drawings are the following figures.

DETAILED DESCRIPTION OF THE INVENTION

Figure 1:
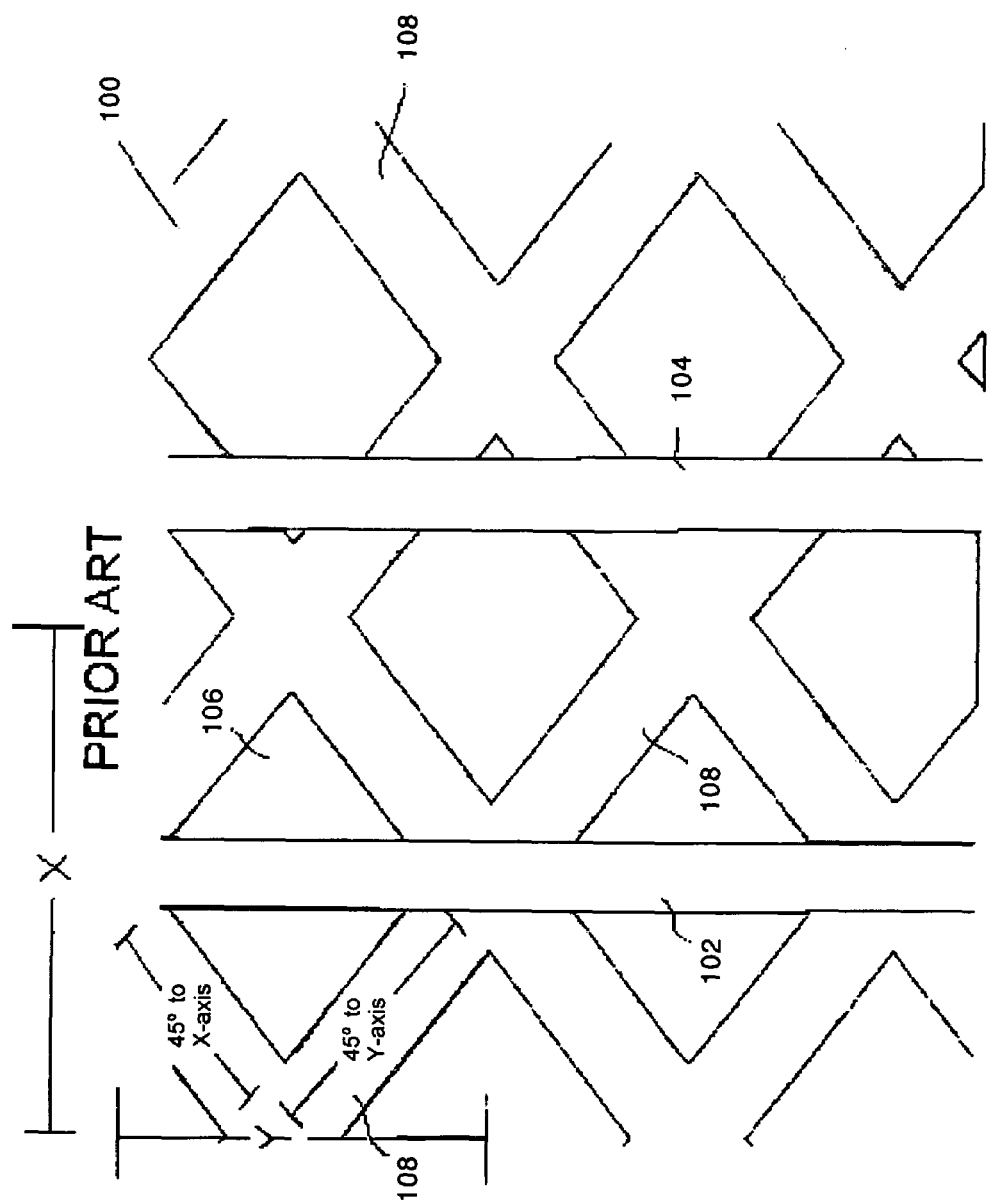
FIG. 1 is a top view of a mesh reference plane spaced from two conductor traces according to the prior art.

Although the invention is illustrated and described herein with reference to specific embodiments, the invention is not intended to be limited to the details shown. Rather, various modifications may be made in the details within the scope and range of equivalents of the claims and without departing from the invention.

The invention is best understood from the following detailed description when read in connection with the accompanying drawing figures, which shows exemplary embodiments of the invention selected for illustrative purposes. The invention will be illustrated with reference to the figures. Such figures are intended to be illustrative rather than limiting and are included herewith to facilitate the explanation of the present invention.

An excellent example of where the present invention would be of significant benefit according to one exemplary embodiment is the case of a flexible circuit laminate. Optionally, the printed circuit laminate is substantially rigid. The use of flexible circuit laminates allows bending of the laminate while retaining many of the desirable attributes of a rigid printed circuit laminate as described above. The degree to which a flexible circuit may be bent repeatedly and the number of cycles it can undergo is directly related to the thicknesses of copper and dielectric layers within the flexible circuit laminate. As such, the reliability and lifespan of a flexible circuit laminate may be significantly improved by a reduction of these thicknesses. Consequently, in many cases it is highly desirable to minimize these thicknesses within a flexible circuit laminate.

Unfortunately, for circuits containing impedance-controlled transmission lines, it is difficult to reduce the thickness of the laminate in a way that will significantly improve the reliability. This is due to the relationship between the thickness of dielectric that separates the transmission line from its reference plane and the impedance of the transmission line. If the thickness of this dielectric is reduced, the impedance will be reduced. In some cases it is possible to get around this problem by decreasing both the dielectric thickness and the transmission line width at the same time. However, manufacturing limitations and reliability of thin transmission lines will constrain the minimum transmission line width. As such, it may not be possible to decrease the dielectric thickness as much as desired.

It might also be possible to decrease the thickness of other layers, unfortunately this usually does not reduce the bending forces as much as would be desired. A seemingly perfect way to solve this problem is to perforate the reference plane to create a mesh. By creating a meshed reference plane, the impedance of the circuit is increased. As such, the dielectric may be made thinner without the need to change the transmission line widths.

This solution would be sufficient except for one consideration. By nature, the meshed plane has a repeating pattern. If this pattern is not oriented properly it will cause differences in impedance that may be unacceptable. These differences could occur between any two lines on the same circuit, or between any two lines on two different circuits. Prior to this invention, there was no defined method to address this problem. This invention addresses this problem in a repeatable, manufacturable, cost-effective way. As will be shown in detail, this invention according to one exemplary embodiment rotates the mesh in a specific way, such that the apparent impedance of any trace on the circuit is the same as any other within the same or a different circuit to a tolerable degree.

According to one exemplary embodiment of the invention, controlling the impedance of printed circuit laminates may include controlling the impedance with greater accuracy. For example, the impedance may be controlled by making the impedance of a single conductor trace equal to a particular value. According to another exemplary embodiment of the invention, controlling the impedance of printed circuit laminates may include controlling the impedance by matching the impedance of at least two conductor traces. For example, the impedance may be controlled by making the impedances of multiple conductor traces equal to each other. For simplicity purposes, the following figures and description illustrate the use of at least two conductor traces and controlling the impedance by matching the impedance of the at least two conductor traces.

The first number of each reference label described herein is the same as the first number of the corresponding figure. For example, reference number 300 appears at FIG. 3. Referring to FIGS. 2-3, 5 and 7, one embodiment of this invention provides a printed circuit laminate comprising at least two conductor traces 302, 304, 502, 702 for carrying forward electrical signals in a first direction of signal propagation. As described above however, it is contemplated that the impedance may be controlled by making the impedance of a single conductor trace equal to a particular value. The at least two conductor traces 302, 304, 502, 702 are substantially parallel to each other. The printed circuit laminate also comprises a mesh reference plane 300, 700, spaced from the at least two conductor traces 302, 304, 502, 702, for carrying return electrical signals in a second direction. The mesh reference plane 300, 700 includes a plurality of cells 200, 308, 500, 704. Each cell of the plurality of cells 200, 308, 500, 704 includes at least one axis of repetition. The plurality of cells 200, 308, 500, 704 are configured so that all the axes of repetition of each cell 200, 308, 500, 704 are different from the first direction of signal propagation.

According to another aspect, the present invention further provides a method for orienting a mesh on a printed circuit laminate for controlling impedance. The method comprises orienting a mesh reference plane 300, 700 having a plurality of cells 200, 308, 500, 704. Each of the plurality of cells 200, 308, 500, 704 has at least one axis of repetition. All of the axes of repetition of each cell 200, 308, 500, 704 are different from the direction of at least one conductor trace 302, 304, 502, 702.

According to another aspect, the present invention further provides a method for controlling impedance in a printed circuit laminate. The method comprises determining a rise time and a period of impedance of a signal propagating in a first direction along a conductor trace 302, 304, 502, 702. The method further comprises determining an angle of rotation θ, β, σ between at least one axis of repetition of cells 200, 308, 500, 704 of a mesh reference plane 300, 700. and the first direction of signal propagation. The determination of the angle θ, β, σ is based on the rise time of the signal and the period of impedance of the signal along the conductor trace 302, 304, 502, 702.

According to another aspect, the present invention further provides a method for producing a printed circuit laminate having controlled impedance. The method comprises determining a rise time and a period of impedance of a signal propagating in a conductor trace 302, 304, 502, 702. The method further comprises determining an angle of rotation θ, β, σ between at least one axis of repetition of cells 200, 308, 500, 704 of a mesh reference plane 300, 700 and a direction of the conductor trace 302, 304, 502, 702 based on the rise time of the signal and the period of impedance of the signal along the conductor trace 302, 304, 502, 702. The method further comprises orienting the mesh reference plane 300, 700 at the determined angle of rotation θ, β, σ between the axis of repetition and the direction of the conductor trace 302, 304, 502, 702.

The impedance of a transmission line may depend, among other things, on the proximity of a forward current and its return current. In most printed circuit laminates, signals may be arranged such that forward currents may be carried in individual wires and return currents may be shared in one or more continuous reference planes. Therefore, it may become easier to control the proximity of the forward and return currents by specifying the distance between the signal conductor and the reference plane.

In order to reduce the overall size, cost and complexity of components it may be desirable to decrease the size of a printed circuit laminate by the decreasing the distance between the signal conductor and the reference plane. However, decreasing the distance between the signal conductor and the reference plane may result in a decrease in the impedance of the signals along the conductor traces. Therefore, it may be desirable to use a perforated reference plane or mesh instead of a solid plane. An example of such a mesh reference plane is shown in prior art FIG. 1.

Figure 2:
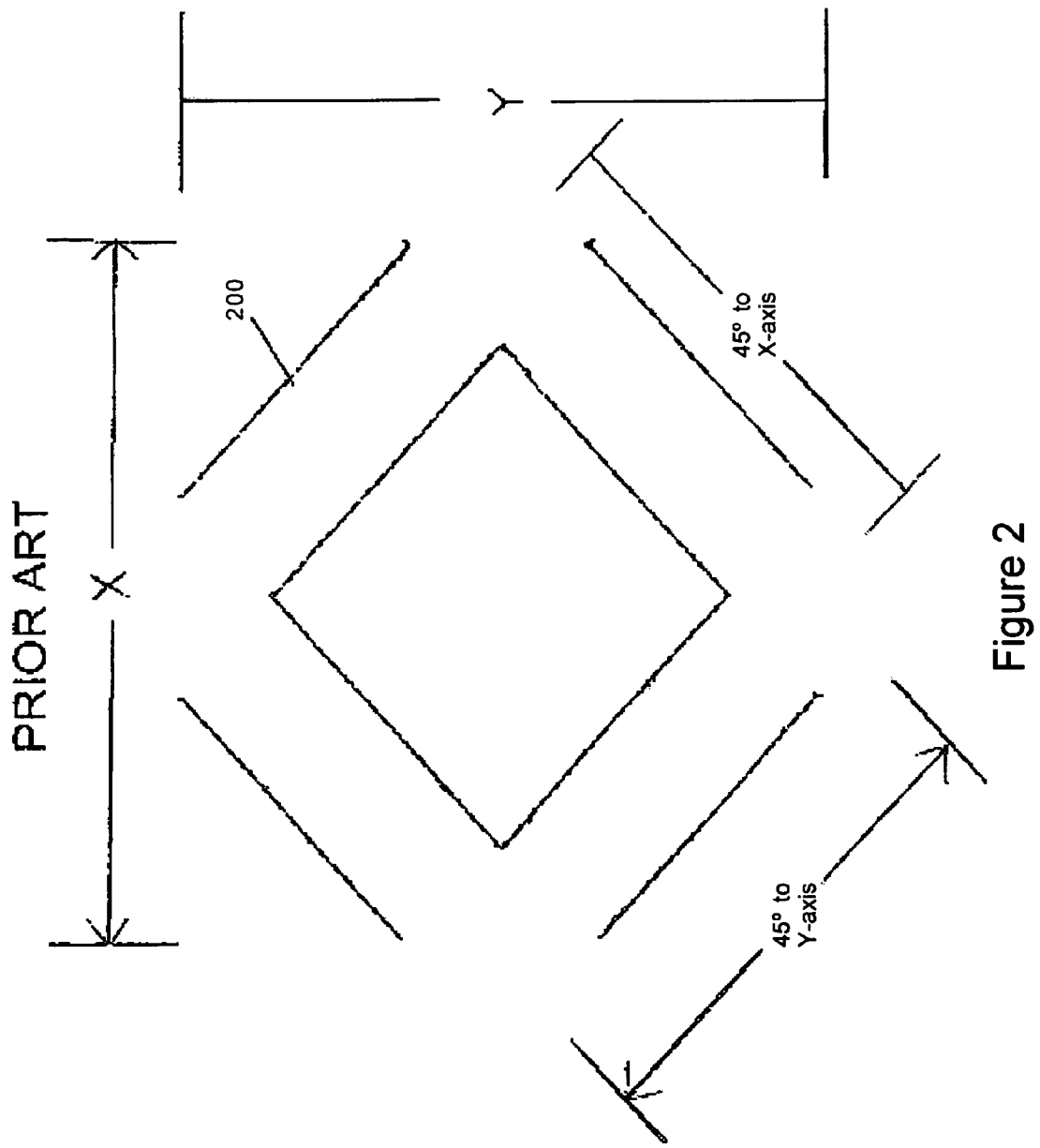
FIG. 2 is a top view of a cell of the mesh reference plane shown in FIG. 1.

As shown in FIG. 1, a mesh reference plane 100 may be spaced from two conductor traces 102, 104 (hereinafter "traces"). FIG. 1 is a top view of a mesh reference plane spaced from two conductor traces according to the prior art. FIG. 2 is a top view of a cell of the mesh reference plane shown in FIG. 1. Labels X, Y, 45 degrees to X-axis and 45 degrees to Y-axis shown in FIG. 1 will be described in connection with FIG. 2. The mesh reference plane 100 may include a plurality of cells 108. Signals may be arranged such that forward currents (not shown) may be carried along traces 102, 104 in a first direction of signal propagation and return currents (not shown) may be carried and shared along the cells 108 of mesh reference plane 100 in a second direction.

If the pitch of the mesh is comparable to or larger than the field distribution of the signal propagation, the variation in proximity may create a significant variation in impedance. For example, as shown in FIG. 1, some parts of the mesh 100 may be closer to each of the traces 102, 104 than other parts of the mesh 100. This may create an undesirable variation in the proximity of the forward and return currents. For example, when the trace 102 passes over the hole 106 in the mesh 100, the return current for the trace 102 may make long detours along mesh reference plane 100. In contrast, for the points along the trace 104, which are substantially parallel to the points where the trace 102 passes over the hole 106, the return current for the trace 104 may simply zigzag along mesh reference plane 100 underneath the trace 104. This may cause the impedance of trace 102 to be higher than the impedance of trace 104.

FIG. 2 is a top view of a cell of the mesh reference plane shown in FIG. 1. Any repetitive shape may be used for an exemplary cell. For example, a triangle or hexagon may be used. As shown in FIG. 2, the cell 200 may be a diamond shape. As described above, return currents (not shown) may be carried and shared along the cell 200 in a second direction. The return currents may be carried along at least one axis of repetition of an exemplary cell. As shown in FIGS. 1 and 2, exemplary cells may include axes of repetition. For example cell 200, which is a top view of a cell of the mesh reference plane shown in FIG. 1 may include four axes of repetition: along the x and y axes, and at 45 degrees relative to the x and y axes. Although the cell shown in FIG. 2 includes four axes of repetition, it is contemplated that an exemplary cell may include any number of axes of repetition.

It may be desirable to run parallel signals which have the same impedance. This may not be possible with a non-skewed mesh since some traces may have consistently high or low impedance because of their orientation relative to the mesh. Therefore according to an exemplary embodiment of the invention, it may be desirable to rotate or skew the mesh to control variations in the impedance and propagation delay of the signals.

Figure 3:
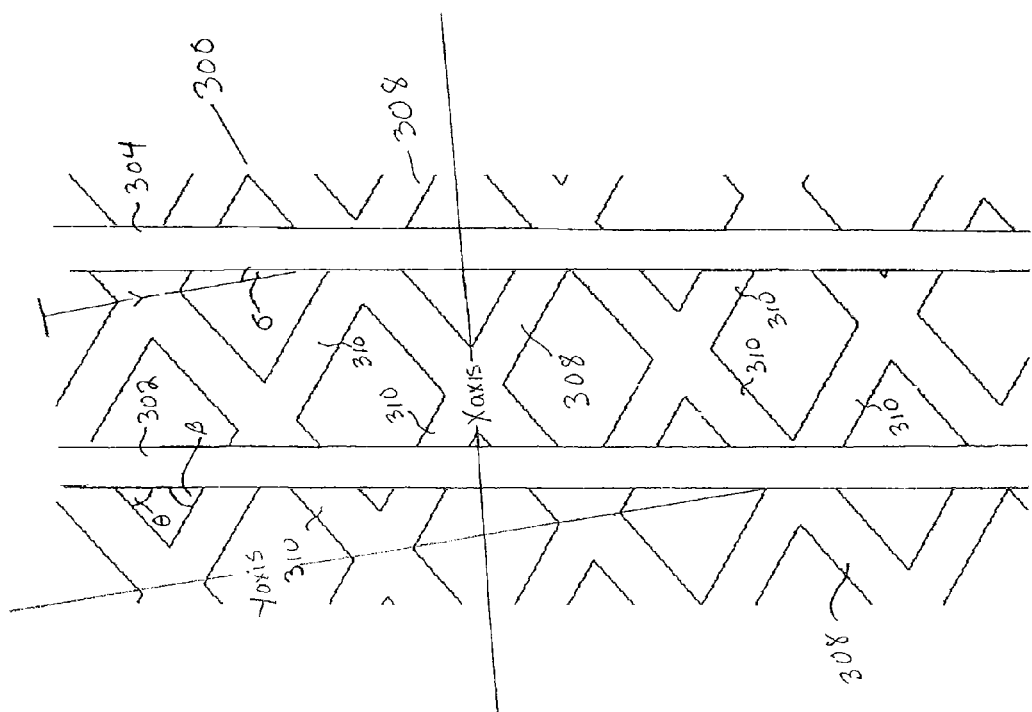
FIG. 3 is a top view of an exemplary skewed mesh reference plane spaced from two exemplary conductor traces according to according to one embodiment of the invention.

FIG. 3 is a top view of an exemplary skewed mesh reference plane spaced from two exemplary conductor traces according to according to one embodiment of the invention. As shown in FIG. 3, a mesh reference plane 300 may be spaced from two traces 302, 304. The mesh reference plane 300 may include a plurality of cells 308. As described above, signals may be arranged such that forward currents (not shown) may be carried along traces 302, 304 in a first direction of signal propagation and return currents (not shown) may be carried and shared along the cells 308 of mesh reference plane 300 in a second direction. Further, each of the cells 308 may include four axes of repetition: along the x and y axes, and at 45 degrees relative to the x and y axes.

According to an exemplary embodiment of the invention, it may be desirable to skew or rotate an exemplary mesh reference plane so that all of the axes of repetition of each exemplary cell are different from the first direction of signal propagation along the exemplary traces. As shown in FIG. 3, the mesh reference plane may be skewed or rotated so that the four axes of repetition of the cells 308 may be different from the first direction of signal propagation along the traces 302, 304. Thus, the axis of signal propagation may not be aligned with any of the axes of mesh cell repetition. At any point along the traces 302, 304, the two respective signals may see different impedances. However, over a predetermined length of each of the at least two traces 302, 304, the impedances of the signals along each of the respective traces 302, 304 may be substantially equal. The predetermined length may be determined by a number of factors, including, but not limited to the length of an exemplary trace from the transmitting end to the receiving end, the time delay of the materials which form an exemplary printed circuit laminate and the exemplary cell dimensions.

As shown in FIG. 3, each cell may include features 310 for carrying the return electrical signals (not shown). According to one exemplary embodiment, the mesh reference plane 300 may configured so that the two traces 302, 304 may be equally spaced from all of the features 310 of the mesh reference plane 300. At any points parallel to the traces 302, 304 respectively, the traces 302, 304 may be spaced differently from all of the features 310. However, over a predetermined length of each of the at least two conductor traces 302, 304, the two traces 302, 304 may be equally spaced from all of the features 310. The predetermined length may be determined by a number of factors, including, but not limited to the length of an exemplary trace from the transmitting end to the receiving end, the time delay of the materials which form an exemplary printed circuit laminate and the exemplary cell dimensions.

An exemplary mesh reference plane and mesh rotation may be designed so that the local impedance fluctuations are short relative to the shortest wavelength of the signal. This process will be described in detail below.

The precise location of mesh reference plane 300, traces 302, 304 and cells 308 shown in FIG. 3 is merely illustrative and is not limiting. As described above, any repetitive shape may be used for an exemplary cell. For example, a triangle or hexagon may be used. It is contemplated that an exemplary cell may include any number of axes of repetition than the four axes of repetition shown in FIG. 3. It is also contemplated that any number of traces may be used. It is further contemplated that an exemplary mesh reference plane spaced from exemplary traces may be a portion of an exemplary printed circuit laminate. An exemplary printed circuit laminate may include any number of mesh reference planes, including multiple layers of mesh reference planes spaced from any number of respective traces.

As described above, it may be desirable to skew or rotate an exemplary mesh reference plane so that all axes of repetition of each exemplary cell are different from the first direction of signal propagation along the exemplary traces. According to one exemplary embodiment, the difference between the axes of repetition of an exemplary cell and the first direction of signal propagation may defined by an angle. As shown in FIG. 3, this angle may be optionally oriented at an angle θ in the range of greater than 0 degrees and less than 45 degrees. Preferably, this angle is in the range of about 1 degree to about 44 degrees with respect to one axis of repetition. More preferably, the angle is in the range of about 2 degrees to about 10 degrees, and most preferably about 5 degrees. This angle may also be optionally oriented at an angle β in the range of greater than 0 degrees and less than 45 degrees. Preferably, this angle is in the range of about 1 degree to about 44 degrees with respect to another axis of repetition. More preferably, the angle is in the range of about 2 degrees to about 10 degrees, and most preferably about 5 degrees. This angle may further be optionally oriented at an angle β in the range of greater than 0 degrees and less than 45 degrees. Preferably, this angle is in the range of about 1 degree to about 44 degrees with respect to yet another axis of repetition Y. More preferably, the angle is in the range of about 2 degrees to about 10 degrees, and most preferably about 5 degrees. The process for determining this angle is described in detail below.

According to one exemplary embodiment, the invention provides a method for orienting a mesh on a printed circuit laminate for controlled impedance. The method comprises orienting a mesh reference plane having a plurality of cells each having at least one axis of repetition such that all of the axes of repetition of each cell are different from the direction of at least two substantially parallel conductor traces. As described above however, according to another exemplary embodiment, a method for controlling the impedance may comprise orienting a mesh reference plane having a plurality of cells each having at least one axis of repetition such that all of the axes of repetition of each cell are different from the direction of only one conductor trace.

Figure 4:
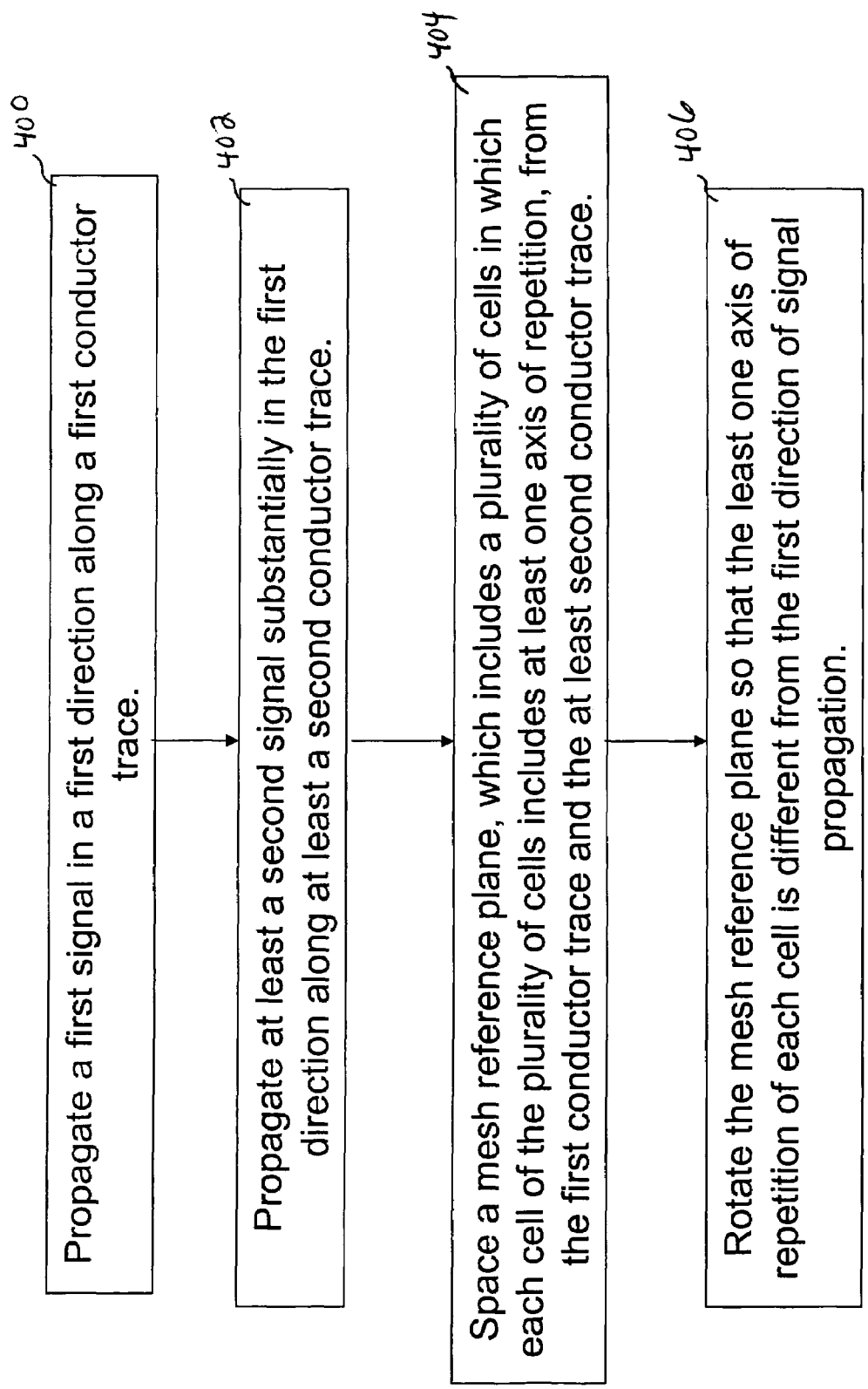
FIG. 4 is a flowchart illustrating an exemplary method for producing a printed circuit laminate having controlled impedance of at least one conductor trace.

According to another embodiment, the invention provides method for orienting a printed circuit laminate having controlled impedance of at least two conductor traces. FIG. 4 is a flowchart illustrating this exemplary embodiment. At step 400, a first signal is propagated in a first direction along a conductor trace. At step 402, at least a second signal is propagated in the first direction along a second conductor trace. (As described above however, step 402 may not be used if the printed circuit laminate includes only one conductor trace). It is contemplated that the first direction of signal propagation may be in either direction along the first and second conductor traces. It is also contemplated that the first direction of signal propagation may change, for example, if alternating current is used.

As described above, it may be desirable to run parallel signals which have the same impedance. Therefore, it may be desirable to rotate or skew a mesh reference plane to control variations in the impedance and propagation delay of the signals. At step 404, a mesh reference plane is spaced from the first and second conductor traces. Desirably, the mesh reference plane may include a plurality of cells. Each cell may include at least one axis of repetition. As described above, signals may be arranged such that forward currents may be carried along traces in a first direction of signal propagation and return currents may be carried and shared along the cells of the mesh reference plane in a second direction. Further, it is contemplated that any repetitive shape may be used for an exemplary cell.

At step 406, the mesh reference plane may be skewed or rotated so that all of the axes of repetition of each cell are different from the first direction of signal propagation. Each cell of the mesh reference plane may include at least one feature for carrying the return electrical signals. According to one exemplary embodiment, the mesh reference plane may be skewed or rotated so that the traces are equally spaced from all of the features of the mesh reference plane over a predetermined length of the traces.

According to another exemplary embodiment the mesh reference plane may be skewed or rotated so that the impedances of each signal along each of the at least two conductor traces is substantially equal over a predetermined length of each of the at least two conductor traces when the signals are propagated along the at least two conductor traces.

According to another exemplary embodiment the mesh reference plane may be skewed or rotated so that the difference between the at least one axis of repetition of each cell and the first direction of signal propagation is defined by angle in the range of greater than 0 degrees and less than 90 degrees. Preferably, this angle is in the range of about 1 degree to about 89 degrees. More preferably, the angle is in the range of about 2 degrees to about 10 degrees, and most preferably about 5 degrees. The process of determining the angle will now be described.

According to one exemplary embodiment, the invention provides a method for controlling impedance in a printed circuit laminate. The method comprises determining a rise time and a period of impedance of a signal propagating in a first direction along a conductor trace. The method also comprises determining an angle of rotation between at least one axis of repetition of cells of a mesh reference plane and the first direction of signal propagation based on the rise time of the signal and the period of impedance of the signal along the conductor trace.

Figure 8:
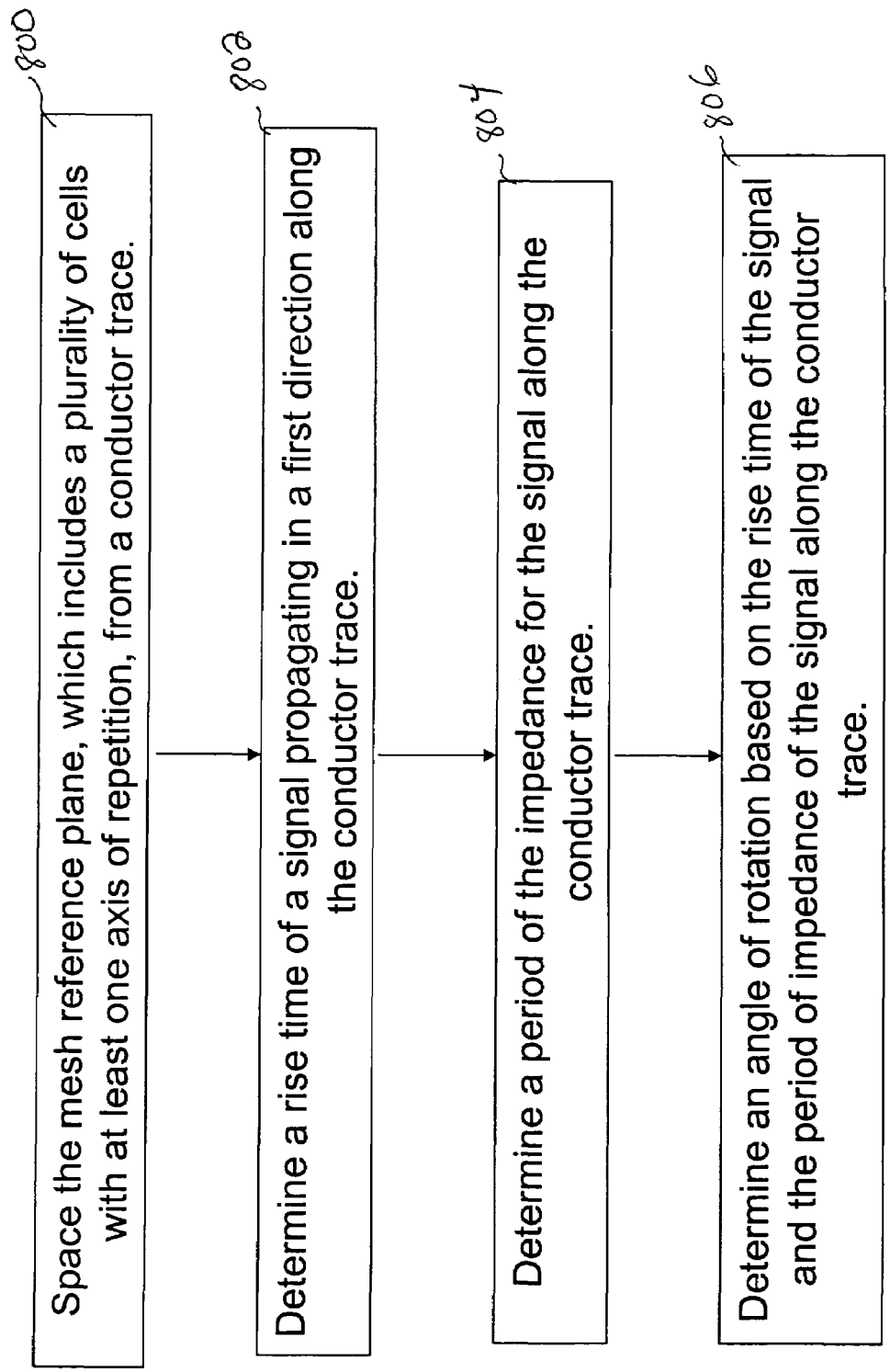
FIG. 8 is a flowchart illustrating an exemplary method for determining an angle of rotation of a mesh reference plane of a printed circuit laminate for controlling impedance.

According to another exemplary embodiment, the invention provides a method for determining an angle of rotation of a mesh reference plane of a printed circuit laminate for controlling impedance. FIG. 8 is a flowchart illustrating this exemplary embodiment. At step 800, an exemplary mesh reference plane may be spaced from an exemplary conductor trace. As described above, the mesh reference plane may include a plurality of cells with each cell including at least one axis of repetition.

Figure 5:
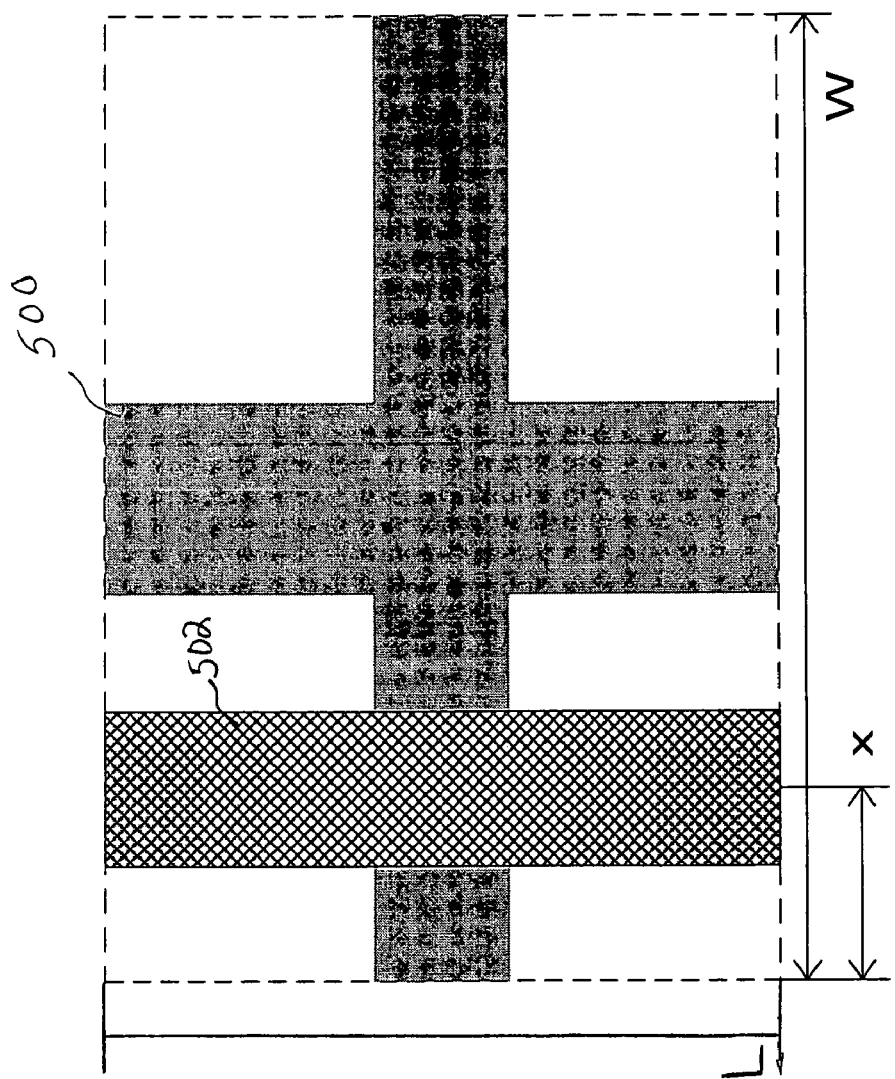
FIG. 5 is a top view of an exemplary cell of an exemplary mesh reference plane with an exemplary trace passing over it according to one embodiment of the invention.

FIG. 5 is a top view of an exemplary cell of an exemplary mesh reference plane with an exemplary trace passing over it. As shown in FIG. 5, an exemplary conductor trace 502 may be routed over a mesh reference plane (not shown) so that a signal may be propagated in a first direction along the conductor trace. The mesh reference plane may be periodic and each cell, such as, for example, cell 500, which may be included in the mesh reference plane, may be of length L and width W. Thus, shifting the mesh in the distance L (in the same direction as the direction of signal propagation), or the distance W, (perpendicular to the direction of signal propagation), results in an identical mesh.

A signal trace 502 over the cell 500 may have an instantaneous impedance which may depend on the signal trace position. Let x be the distance from the left edge of the cell to the trace centerline, so the trace centerline may be anywhere between x=0 and x=W.

Figure 6:
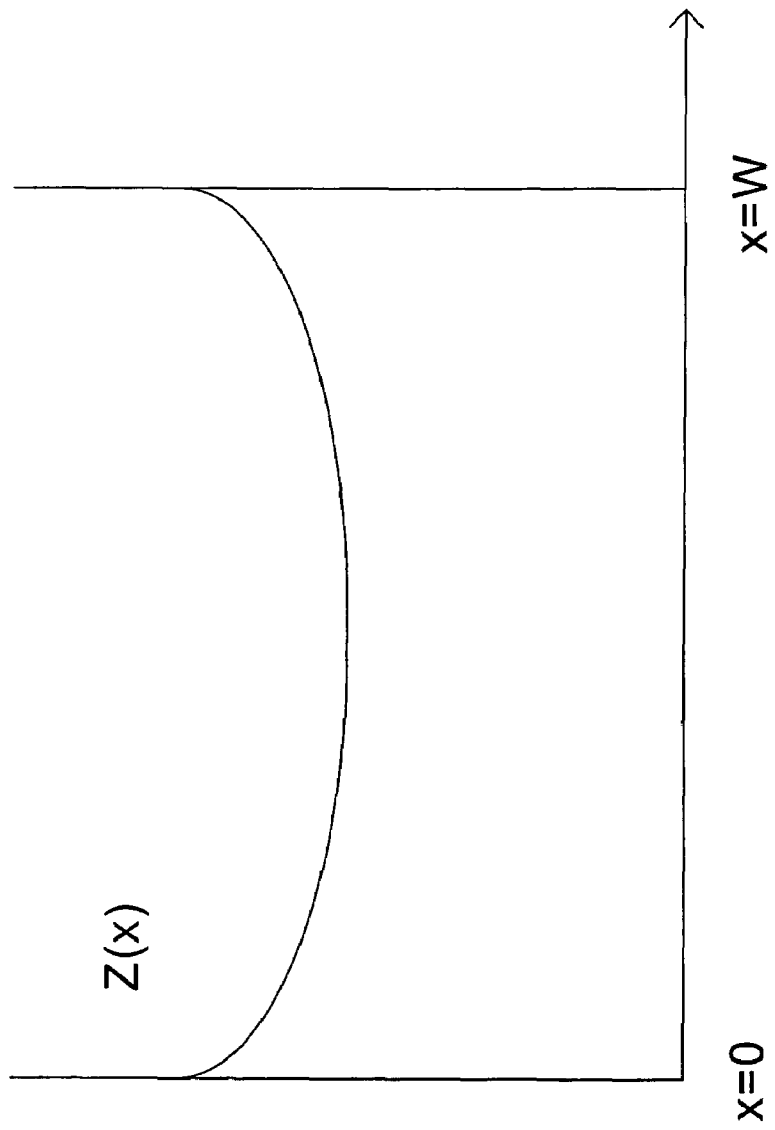
FIG. 6 is a graph illustrating the impedance of the exemplary conductor trace shown in FIG. 5 as a function of its position relative to the exemplary cell shown in FIG. 5.

FIG. 6 is a graph illustrating the impedance of the exemplary conductor trace shown in FIG. 5 as a function of its position relative to the exemplary cell shown in FIG. 5. As shown in FIG. 6, the trace's impedance Z(x) may be high if it is on the left side (x=0) or the right side (x=W) of the cell 500. In contrast, the trace's impedance Z(x) may be low if it passes over the middle of the cell 500.

Figure 7B:
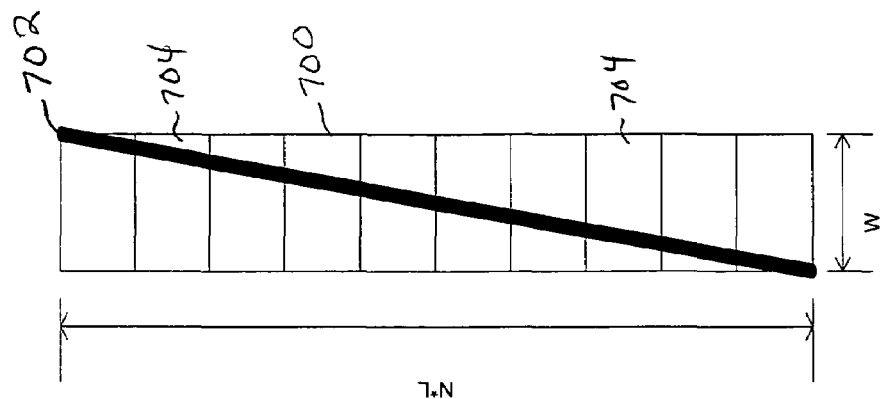
FIGS. 7A and 7B are drawings illustrating a signal trace as it passes over 10 mesh cells, before and after the exemplary mesh is rotated, according to one embodiment of the invention.
Figure 7A:
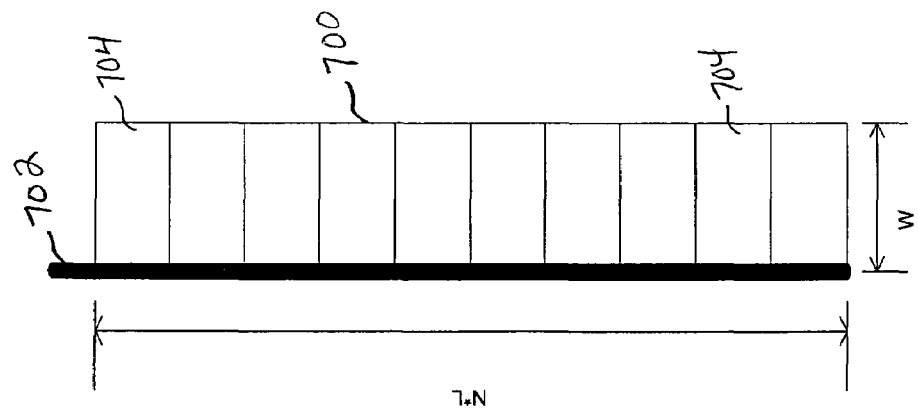

FIGS. 7A and 7B are drawings illustrating a signal trace as it passes over 10 mesh cells, before and after the exemplary mesh is rotated, according to one embodiment of the invention. As shown in FIG. 7A, a signal trace 702 passes over a section of the mesh 700, N mesh cells long (here N=10), and each mesh cell having a width W. Let L represent the length of each mesh cell. As described above with reference to FIG. 6, x=0 when the signal trace is on the left side of the mesh cell. X=0 for all of the cells 704 in FIG. 7A. Thus, the signal trace 702 may have a high impedance and may remain constant for the duration of its run. FIG. 7B shows the signal trace 702 and the mesh 700 rotated relative to each other. As shown in FIG. 7B, the trace 702 travels one cell right as it travels N cells up. In this case, the impedance of the line may vary along the length of the line, starting at a maximum, traveling through the minimum and ending at the maximum. Now the impedance may be periodic. The period T is given by Equation (1).

$$T = (TD) * \sqrt{(NL)^2 + W^2} \qquad (1)$$

where TD is the time delay (in units of seconds per inch) of the printed circuit laminate material, N is the number of mesh cells sampled before repeating, L is the length of a mesh cell of an exemplary mesh reference plane, and W is the width of a mesh cell of an exemplary mesh reference plane. To first order, time delay is independent of the arrangement of the reference mesh.

According to one exemplary embodiment of the invention, a determination may be made for the minimum constraint on the number of times N the mesh is sampled before repeating. It may be desirable to achieve good coverage of the mesh. Thus, a number of factors may be used to determine a minimum constraint on N. For example, N may be set to more than about 8 samples as shown in equation (2).

$$N > 8 \quad (2)$$

According to one exemplary embodiment of the invention, a determination may be made for the maximum constraint on the number of times N the mesh is sampled before repeating. Given that N is at least about 8, and assuming that L and W are approximately equal, we can make the approximation $$(NL)^2 >> W^2 \quad (3)$$

so that Equation (1) reduces to $$T \neq (TD)*(NL) \quad (4)$$

Referring back to FIG. 8, at step 802, a rise time of a signal propagating in a first direction along an exemplary conductor trace may be determined. It may be desirable to ensure that the period may be short enough that it may be imperceptible to the signals traveling in the printed circuit laminate. This may be done by comparing the impedance period to the signal risetime. Impedance discontinuities that are small compared to a risetime may not cause reflections. In contrast, they may be averaged out. That is, the impedances of the signal trace may be substantially equal over a predetermined length of each of the trace.

For example, consider a transmission line that is mostly 50 Ohms and has one section which is 60 Ohms. There are two discontinuities in this line. One discontinuity is at the 50→60 interface and one at the 60→50 interface. Any wave incident on either of those interfaces may be partly reflected and partly transmitted. A wave may be defined as any change in voltage with respect to time (dV/dt). Assume that the duration of the 60-Ohm segment is 40 ps and that a wave may come along which may change in amplitude from 0 volts to 1 volt over an interval of 100 ps. When the wave hits the first discontinuity, the discontinuity experiences a dV/dt and generates both a reflected and transmitted wave. Forty picoseconds later, the second discontinuity may experience a dV/dt and may generate a reflected and transmitted wave. Forty picoseconds after that, the reflection from the second discontinuity may have traveled back and may be located at the first discontinuity. However, the initial dV/dt may still be present at the first discontinuity. The stimulus risetime may be 100 ps but the delay between the two discontinuities may only be 40 ps, so it may be possible to make a round-trip journey between the two before the initial dV/dt finishes.

Under the conditions described above, the reflections from the two discontinuities may overlap. For an observer outside the 60-Ohm section, it may be impossible to distinguish the two discontinuities with a 100-ps risetime. The discontinuities may be considered as the minimum and maximum impedances in a period, so the time interval between discontinuities may be determined to be T/2<tR/2 or T<tR. This time interval may be used to achieve reflections which may be acceptably small. For example, another factor of 2 may be taken for margin to achieve acceptable reflections. Therefore, we may need to satisfy the following inequality:

$$T \leq t_R/2 \quad (5)$$

where $t_R$ is the signal rise time.

After inequality (5) is satisfied, at step 804, a period of the impedance for the signal along the conductor trace may be determined.

Substituting Equation (4), the constraint on the maximum N becomes $$N \leq \frac{t_R}{2*L*(TD)} \quad (6)$$

At step 806, an angle of rotation may be determined based on the rise time of the signal and the period of impedance of the signal along the conductor trace. The angle of rotation defining the difference between the at least one axis of repetition of each cell and the first direction of signal propagation angle may be found from Equation (7).

$$\alpha = \tan^{-1}\left(\frac{W}{N*L}\right) \quad (7)$$

For example, it may be determined that exemplary mesh cells may be square in shape and may be 20 mils on a side (L=W=0.02 in). It may further be determined that the time delay of the circuit may be 150 ps/in and that the risetime of the signals may be 500 ps. Thus, the allowable range for N may be $$8 \leq N \leq 78 \quad (8)$$

Choosing N=12, the angle defining the difference between the at least one axis of repetition of each cell and the first direction of signal propagation angle may be determined to be:

$$\alpha = 4.8° \quad (9)$$

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A printed circuit laminate comprising:
   at least one conductor trace, for carrying forward electrical signals in a first direction of signal propagation; and
   a mesh reference plane, spaced from the at least one conductor trace, for carrying return electrical signals in a second direction, the mesh reference plane defining a plurality of cells,
   wherein each cell of the plurality of cells includes at least one axis of repetition and the plurality of cells are configured so that all of the axes of repetition of each cell are different from the first direction of signal propagation, and
   the at least one axis of repetition is skewed from the first direction of the at least one conductor trace by an angle determined from the rise time of the electrical signals and the period of impedance of the electrical signals along the at least one conductor trace.

2. A printed circuit laminate according to claim 1, wherein the difference between each of the axes of repetition of each cell and the first direction of signal propagation is defined by an angle in the range of greater than 0 degrees and less than 90 degrees.

3. A printed circuit laminate according to claim 1, wherein the difference between each of the axes of repetition of each cell and the first direction of signal propagation is defined by an angle in the range of about 1 degree to about 89 degrees.

4. A printed circuit laminate according to claim 1, wherein the difference between each of the axes of repetition of each cell and the first direction of signal propagation is defined by an angle in the range of about 2 degrees to about 10 degrees.

5. A printed circuit laminate according to claim 1, wherein the difference between each of the axes of repetition of each cell and the first direction of signal propagation is defined by an angle in the range of about 3 degrees to about 5 degrees.

6. A printed circuit laminate according to claim 1, wherein each cell includes at least one feature for carrying the return electrical signals and the mesh reference plane is configured so that the at least one conductor trace is equally spaced from all of the features of the mesh reference plane over a predetermined length of the at least one conductor trace.

7. A printed circuit laminate according to claim 1, wherein the mesh reference plane is configured so that the impedances of each signal along each of the at least one conductor trace is substantially equal over a predetermined length of each of the at least one conductor trace when the signals are propagated along the at least one conductor trace.

8. A printed circuit laminate according to claim 1, comprising at least two conductor traces, for carrying forward electrical signals in a first direction of signal propagation, wherein the at least two conductor traces are substantially parallel to each other.

9. A printed circuit laminate according to claim 1, wherein the printed circuit laminate is substantially rigid.

10. A printed circuit laminate according to claim 1, wherein the printed circuit laminate is substantially flexible.

* * * * *